US012641913B2

(12) United States Patent
Nakazawa et al.

(10) Patent No.: US 12,641,913 B2
(45) Date of Patent: May 26, 2026

(54) PHOTOELECTRIC CONVERSION ELEMENT INCLUDING TRANSITION METAL DICHALCOGENIDE THIN FILM AND LIGHT-RECEIVING ELEMENT INCLUDING THE PHOTOELECTRIC CONVERSION ELEMENT

(71) Applicants: TANAKA KIKINZOKU KOGYO K.K., Tokyo (JP); University Industry Foundation, Yonsei University, Seoul (KR)

(72) Inventors: Tatsuya Nakazawa, Isehara (JP); Shinichi Kato, Hiratsuka (JP); Hyung Jun Kim, Seoul (KR); Dong Hyun Kim, Seoul (KR)

(73) Assignees: TANAKA KIKINZOKU KOGYO K.K., Tokyo (JP); University Industry Foundation, Yonsei University, Seoul (KR)

(*) Notice: Subject to any disclaimer, the term of this patent is extended or adjusted under 35 U.S.C. 154(b) by 237 days.

(21) Appl. No.: 18/273,948

(22) PCT Filed: Oct. 4, 2021

(86) PCT No.: PCT/JP2021/036590
§ 371 (c)(1),
(2) Date: Jul. 24, 2023

(87) PCT Pub. No.: WO2022/163024
PCT Pub. Date: Aug. 4, 2022

(65) Prior Publication Data
US 2024/0313137 A1    Sep. 19, 2024

(30) Foreign Application Priority Data
Jan. 26, 2021    (JP) ................................ 2021-010228

(51) Int. Cl.
*H01L 31/0384* (2006.01)
*B22F 1/054* (2022.01)
(Continued)

(52) U.S. Cl.
CPC ........ *H10F 77/1625* (2025.01); *B22F 1/0547* (2022.01); *C01B 19/04* (2013.01);
(Continued)

(58) Field of Classification Search
None
See application file for complete search history.

(56) References Cited

U.S. PATENT DOCUMENTS

| | | | |
|---|---|---|---|
| 4,801,991 A | 1/1989 | Hisa | |
| 2008/0158501 A1* | 7/2008 | Matsunami ......... | G02B 5/3058 977/777 |

(Continued)

FOREIGN PATENT DOCUMENTS

| | | |
|---|---|---|
| CN | 106984830 A | 7/2017 |
| CN | 110676332 A | 1/2020 |

(Continued)

OTHER PUBLICATIONS

Office Action issued in corresponding Japanese Patent Application No. 2022-578042 dated Feb. 3, 2025.

(Continued)

*Primary Examiner* — Ronak C Patel
(74) *Attorney, Agent, or Firm* — Foley & Lardner LLP

(57) ABSTRACT

A photoelectric conversion element including a thin film composed of a transition metal dichalcogenide and formed on a base material. In the present invention, a surface of the thin film composed of the transition metal dichalcogenide is modified with at least any nanorod particles of Au nanorod particles composed of Au and Ag nanorod particles composed of Ag. An average aspect ratio of the Au nanorod
(Continued)

particles is 3.0 or more and 12.0 or less, and an average aspect ratio of the Ag nanorod particles is 3.0 or more and 13.0 or less. In the invention, the sensitivity to light having wavelengths in the near-infrared region improves by a sensitizing action attributed to localized surface plasmon resonance that is developed by the Au and Ag nanorod particles.

9 Claims, 11 Drawing Sheets

(51) Int. Cl.

| | | |
|---|---|---|
| *C01B 19/04* | (2006.01) | |
| *G01S 7/481* | (2006.01) | |
| *H01L 31/032* | (2006.01) | |
| *H10F 77/12* | (2025.01) | |
| *H10F 77/162* | (2025.01) | |

(52) U.S. Cl.

CPC ...... *H10F 77/127* (2025.01); *B22F 2301/255* (2013.01); *B22F 2304/054* (2013.01); *G01S 7/4816* (2013.01)

(56) References Cited

U.S. PATENT DOCUMENTS

| | | | |
|---|---|---|---|
| 2008/0259262 A1 | 10/2008 | Jones et al. | |
| 2012/0164717 A1 | 6/2012 | Irudayaraj | |
| 2015/0372163 A1* | 12/2015 | Kim ....................... | H10F 77/20 |
| | | | 428/209 |
| 2016/0111460 A1 | 4/2016 | Wober | |
| 2018/0105930 A1 | 4/2018 | Kang et al. | |
| 2018/0326498 A1 | 11/2018 | Yang et al. | |
| 2019/0288160 A1* | 9/2019 | Atature ................ | H10H 29/142 |
| 2019/0348564 A1 | 11/2019 | Lin et al. | |
| 2019/0386208 A1* | 12/2019 | Lin ........................ | H10N 50/10 |

FOREIGN PATENT DOCUMENTS

| | | | |
|---|---|---|---|
| CN | 110993703 | A | 4/2020 |
| CN | 110993731 | A | 4/2020 |
| CN | 111029416 | A | 4/2020 |
| CN | 111816716 | A | 10/2020 |
| JP | H69240 | B2 | 2/1994 |
| JP | 2007-165359 | A | 6/2007 |
| JP | 2018-525516 | A | 9/2018 |
| TW | 201543701 | A | 11/2015 |
| TW | 201619398 | A | 6/2016 |
| TW | 201622164 | A | 6/2016 |
| TW | 201947749 | A | 12/2019 |

OTHER PUBLICATIONS

International Search Report and Written Opinion issued in connection with PCT Appl. Ser. No. PCT/JP2021/036590 dated Nov. 16, 2021.

Taiwan Office Action issued in connection with TW Appl. Ser. No. 110137042 dated Mar. 1, 2023.

Taiwan Office Action issued in connection with TW Appl. Ser. No. 110137042 dated May 27, 2022.

Taiwan Office Action issued in connection with TW Appl. Ser. No. 110137042 dated Sep. 26, 2022.

Zhang et al., "Recent Progress and Challenges Based on Two-Dimensional Material Photodetectors", Nano-Express, Jan. 4, 2021, vol. 2, Article No. 012001, pp. 1-21.

Office Action issued in corresponding Korean Patent Application No. 10-2023-7027853 dated Aug. 5, 2024 (14 pages).

Cristiano et al., "Quantifying and optimizing photocurrent via optical modeling of gold nanostar-, nanorod-, and dimer-decorated MoS2 and MoTe2", The Journal of Chemical Physics, 2020 year, vol. 152, pp. 014705-1-014705-8.

Japanese Office Action issued in corresponding Japanese Patent Application No. 2022-578042 dated Jun. 23, 2025 (7 pages).

Wang et al., "High-speed infrared two-dimensional platinum diselenide photodetectors", Applied Physics Letters, 2020 year, vol. 116, pp. 211101-1-211101-6.

Office Action issued in corresponding German Patent Application No. 112021006938.1 dated Oct. 27, 2025.

* cited by examiner

Fig. 8

PHOTOELECTRIC CONVERSION ELEMENT INCLUDING TRANSITION METAL DICHALCOGENIDE THIN FILM AND LIGHT-RECEIVING ELEMENT INCLUDING THE PHOTOELECTRIC CONVERSION ELEMENT

CROSS-REFERENCE TO RELATED APPLICATIONS

The present application claims priority under 35 U.S.C. § 371 to International Patent Application No. PCT/JP2021/036590, filed Oct. 4, 2021, which claims priority to and the benefit of Japanese Patent Application No. 2021-010228, filed on Jan. 26, 2021. The contents of these applications are hereby incorporated by reference in their entireties.

BACKGROUND OF THE INVENTION

Field of the Invention

The present invention relates to a photoelectric conversion element including a thin film composed of a transition metal dichalcogenide. Specifically, the present invention relates to a photoelectric conversion element in which the surface of a thin film composed of a transition metal dichalcogenide is modified with metallic nanorod particles, whereby a response characteristic to light having wavelengths in the near-infrared region is improved by localized surface plasmon resonance of the metallic nanorod particles, and to a light-receiving element including the photoelectric conversion element.

Description of the Related Art

In recent years, as a semiconductor material constituting a variety of semiconductor devices such as light-receiving devices or field-effect transistors (FET) provided with a light-receiving element or a photoelectric conversion element such as a solar cell, transition metal dichalcogenide (TMDC) has been attracting attention. A transition metal dichalcogenide refers to a compound ($MX_2$) of a metal (M) of a Group 3 element to Group 11 element, which belongs to transition metals, and a chalcogenide element (X) except oxygen. Transition metal dichalcogenides exhibit peculiar electric characteristics or optical semiconductor characteristics based on the kind of the central metal M and are thereby used in a variety of applications described above (for example, Patent Document 1).

As an application where the application of transition metal dichalcogenides is particularly expected, photoelectric conversion elements constituting light-receiving elements such as sensors are an exemplary example. As an example, light-receiving elements that are applied to light detection and ranging (LIDAR) will be described. LIDAR is a sensing technique where laser light is used and is a system in which a subject is irradiated with laser light, a reflected light is sensed with a light-receiving element and the distance or angle of the subject is detected. LIDAR has an advantage of being capable of highly accurately detecting the distance or angle of a subject compared with detecting systems where a camera or a millimeter-wave radar is used. In addition, LIDAR has been thus far a technique that is utilized as a remote sensing system in automobile self-driving, drones, ships and the like. In addition, recently, LIDAR also has been applied to face recognition techniques or augmented reality in smartphones, tablets or the like.

Examples of semiconductor materials that have been thus far being studied as photoelectric conversion elements that are applied to LIDAR include HgCdTe alloys ($Hg_{1-x}Cd_xTe$ alloys: MCT alloys) or InGaAs alloys ($In_{1-x}Ga_xAs$ alloys) (for example, Patent Document 2 and Patent Document 3). In these semiconductor alloys, it is possible to adjust the band gaps by setting an appropriate composition (x) and to detect a wide range of infrared rays of 1 to 30 μm. Light-receiving elements (photoconductive elements) using these alloys have already been commercially available.

However, upon application of HgCdTe alloys or InGaAs alloys to light-receiving elements for LIDAR, problems in terms of performance, manufacturing cost or the like have been pointed out. In terms of performance, for HgCdTe alloys, the SN ratio is low at room temperature, and elements need to be cooled to be operated with no generation of noise. Addition of a cooling mechanism to light-receiving element units for cooling is not preferable in drones, smartphones and the like where size reduction is essential. In addition, even in automobile equipment for which operation at room temperature is premised, addition of a cooling mechanism is not preferable. InGaAs alloys also have a problem of poor responsiveness at room temperature, and high operating voltages and unstable structure.

In addition, devices using HgCdTe alloys and InGaAs alloys also have a problem with the manufacturing cost. The use of molecular beam epitaxy (MBE) is essential to manufacture the devices with these alloys in desired compositions. MBE is a thin film formation process that is performed in an ultrahigh vacuum and has a low manufacturing efficiency since it requires a long time to form thin films with a desired thickness. In addition, in the case of manufacturing these alloys by MBE, substrate materials are limited to CdZnTe, GaAs and the like, which are expensive.

Transition metal dichalcogenides do not have the above-described problems that are pointed out for HgCdTe alloys and InGaAs alloys. Transition metal dichalcogenides have been reported to have a high SN ratio in the room temperature range, and problems in terms of performance during use in the room temperature range can be solved. In addition, methods for manufacturing transition metal dichalcogenides are not limited to MBE, and a variety of thin film formation processes are applicable. Particularly, transition metal dichalcogenides can be manufactured by a chemical deposition method such as a chemical vapor deposition method (CVDM) or an atomic layer deposition method (ALDM), which is known as a high-yield thin film formation process. In addition, at that time, there is a wide choice of substrate materials, and the materials can be formed into Si wafers or glass substrates ($SiO_2$). Therefore, transition metal dichalcogenides are deemed to be superior in terms of cost as well.

PRIOR ART DOCUMENT

Patent Documents

Patent Document 1

National Publication of International Patent Application No. 2018-525516

Patent Document 2

Examined Japanese Patent Publication No. H6-9240

Patent Document 3

Japanese Patent Application Laid-Open No. 2007-165359

SUMMARY OF THE INVENTION

Technical Problem to be Solved by the Present Invention

Photoelectric conversion elements such as light-receiving elements are required to have high responsiveness to light in wavelength ranges suitable for applications. Light-receiving elements that are applied to LIDAR described above are required to have a response characteristic to light having a wavelength in the near-infrared region. Regarding these points, transition metal dichalcogenides are two-dimensional materials having a layered structure and semiconductor materials having a band gap that changes depending on the number of layers therein. Thus, transition metal dichalcogenides with appropriate constitution are capable of exhibiting photoresponsivity in a wide wavelength range.

Surely, it does not necessarily mean that there is no room for improvement in the photoresponsivity of transition metal dichalcogenides. Transition metal dichalcogenides are deemed to have photoresponsivity in a wide wavelength range, but it is not easy to deem that transition metal dichalcogenides always have a sufficient sensitivity. In order to improve the performance of light-receiving elements for LIDAR described above, improvement in the sensitivity of transition metal dichalcogenides at wavelengths in the near-infrared region is desired, but there is a limitation on achieving the improvement only by improvement in the constitution of transition metal dichalcogenides.

The present invention has been made in consideration of the above-described circumstances, and an objective of the present invention is to provide a photoelectric conversion element including a transition metal dichalcogenide thin film having an improved sensitivity to light having wavelengths in the near-infrared region. In the present invention, light in the near-infrared region to which the sensitivity is to be improved is light having wavelengths of near 700 nm to near 1600 nm.

Solution to Problem

The present invention, which solves the problems, is a photoelectric conversion element including a base material and a thin film formed on the base material and composed of a transition metal dichalcogenide, wherein a surface of the thin film composed of the transition metal dichalcogenide is modified with at least any nanorod particles of Au nanorod particles composed of Au and Ag nanorod particles composed of Ag, an average aspect ratio (major axis/minor axis) of the Au nanorod particles is 3.0 or more and 12.0 or less, and an average aspect ratio (major axis/minor axis) of the Ag nanorod particles is 3.0 or more and 13.0 or less.

In the present invention, the transition metal dichalcogenide thin film surface is modified with at least any of the metallic nanorod particles composed of Au or Ag, whereby the light sensitivity of the thin film in the near-infrared range improves. Specifically, the present invention sensitizes the photoelectric effect of the transition metal dichalcogenide thin film by localized surface plasmon resonance (LSPR) that is developed with metallic nanorod particles having a predetermined aspect ratio. Here, plasmon resonance refers to a phenomenon in which free electrons on a metal surface excited by an external electric field such as light irradiation collectively vibrate and resonate with the external electric field. In addition, resonance with the external electric field of the vibration of the surface free electrons that is caused in the nanoparticles of the predetermined metal such as Au or Ag is referred to as localized plasmon resonance. In addition, the wavelength of light causing the localized plasmon resonance in the nanoparticles of Au, Ag or the like changes depending on the aspect ratios of the nanoparticles. In the present invention, the transition metal dichalcogenide is modified with rod-like nanoparticles composed of Au or Ag and having an appropriate aspect ratio (hereinafter, referred to as the nanorod particles), whereby the response characteristic in the near-infrared region is improved.

As described above, main constituents of the photoelectric conversion element of the present invention are the transition metal dichalcogenide thin film having a photoelectric effect, and the nanorod particles that amplify the photoelectric effect of the thin film by localized surface plasmon resonance. Hereinafter, the constitution of the photoelectric conversion element of the present invention and a method for manufacturing the same, as well as a light-receiving element to which the photoelectric conversion element of the present invention is applied, will be described in detail.

(A) Constitution of Photoelectric Conversion Element of Present Invention (A-1) Transition Metal Dichalcogenide Thin Film As described above, the transition metal dichalcogenide refers to a compound ($MX_2$) of a metal (M) of a Group 4 element to Group 11 element, which belongs to transition metals, and a chalcogenide element (X) except oxygen. Specific examples of the transition metal constituting the transition metal dichalcogenide thin film of the photoelectric conversion element of the present invention include tungsten (W), molybdenum (Mo), platinum (Pt), palladium (Pd), hafnium (Hf), zirconium (Zr) and the like. In addition, examples of the chalcogen element include sulfur (S), selenium (Se) and tellurium (Te).

In addition, a particularly preferable transition metal dichalcogenide in the present invention is a chalcogenide of Pt or Pd, which is a platinum group metal. Chalcogenides of these platinum group metals are semiconductor materials having a band gap that is superior in terms of a photoelectric effect in the near-infrared region. Therefore, a sensitizing effect of the nanorod particles makes it possible to exhibit a response characteristic particularly excellent with respect to light in the near-infrared region. The chalcogenides of Pt and Pd are specifically $PtSe_2$, $PtS_2$, $PtTe_2$, $PdSe_2$, $PdS_2$ and $PdTe_2$. Transition metal dichalcogenides of other metals such as Mo and W have a band gap that is approximately 1 eV larger than those of dichalcogenides of Pt and Pd and are somewhat unsuitable for use in the near-infrared region. However, even in chalcogenide thin films of transition metals other than Pt and Pd, the sensitizing effect of modification with the Au or Ag nanorod particles is recognized, and thus the use of nanorod particles for these transition metal dichalcogenides is not avoided.

The transition metal dichalcogenide is a two-dimensional substance in which individual constituent elements strongly bond to each other by ionic bonds and/or covalent bonds, and the thin film of the transition metal dichalcogenide has a structure in which unit layers composed of the two-dimensional substance are laminated in layers. The unit layers of the transition metal dichalcogenide bond to each other with a relatively weak bond (Van der Waals force). In the thin film of the transition metal dichalcogenide in the present invention, the number of the unit layers constituting the thin film can be one or plural. Since the band gap as a semiconductor thin film changes depending on the number of these layers, it is possible to adjust the number of the layers in accordance with a device to which the photoelectric conversion element is applied. Therefore, in the present invention, there is no need to limit the thickness of the transition metal dichalcogenide thin film. For example, in the case of application to optical elements for LIDAR or the like, the number of the layers is preferably one or more and three or less and more preferably one or more and two or less. The thickness of the thin film at this time becomes 0.5 to 5 nm.

(A-2) Au Nanorod Particles and Ag Nanorod Particles

In the present invention, what modifies the thin film composed of the transition metal dichalcogenide is nanorod particles composed of Au (gold) and/or nanorod particles composed of Ag (silver). When made into nanoparticles, these metals predominantly develop localized surface plasmon resonance. In the present invention, the Au nanorod particles are particles composed of Au alone, and the Ag nanorod particles are particles composed of Ag alone. In addition, for the modification of the transition metal dichalcogenide thin film, modification is performed with at least any of the Au nanorod particles and the Ag nanorod particles.

The mechanism of the sensitizing action of the transition metal dichalcogenide thin film by the localized surface plasmon resonance of the nanorod particles composed of Au or Ag is presumed to arise from hot carriers generated by the damping of resonant vibration. Localized surface plasmon resonance is known to be damped by radioactive re-emission accompanying photo emission or non-radioactive Landau damping accompanying the decay of high energy into an electron-hole pair (hot carrier). In the present invention, it is presumed that hot electrons generated through the latter Landau damping are injected into the transition metal dichalcogenide, which increases the carrier density and thereby increase the number of photoelectrons, whereby the response performance improves. That is, the sensitizing action in the present invention can be deemed to arise from the carrier injection into the transition metal dichalcogenide, which is an electron acceptor, by the nanorod particles, which are an electron donor.

Such a sensitizing action by the localized surface plasmon resonance of the nanorod particles effectively acts regardless of the magnitude of the band gap of the transition metal dichalcogenide thin film, which becomes a base. It is known that, as the number of the layers increases, the band gap of a two-dimensional material such as the transition metal dichalcogenide becomes smaller and a photocurrent to be generated decreases. The present invention is still effective with respect to the transition metal dichalcogenide thin film in such a region where the band gap is small. For example, regarding a $PtSe_2$ thin film, a photocurrent sensitizing action by nanorod particles is extremely effectively exhibited with respect to the thin film in which there is a region where the band gap is as small as 1 eV.

The wavelength of light that causes the nanorod particles to develop the localized surface plasmon resonance changes depending on the aspect ratios (major axis/minor axis) of the nanorod particles. Specifically, the sensitizing action by the nanorod particles develops with respect to light on the short wavelength side when the aspect ratios are low and develops with respect to light on the long wavelength side when the aspect ratios are high. In addition, in order to cause the sensitizing action to be exhibited in a wavelength range in the near-infrared region, the aspect ratios of the Au nanorod particles is 3.0 or more and 12.0 or less, and the aspect ratios of the Ag nanorod particles is 3.0 or more and 13.0 or less. In the present invention, it is possible to modify the thin film surface with a plurality of kinds of nanorod particles, and the aspect ratios in that case are the average value thereof.

The wavelength dependency of the light that causes the nanorod particles to develop the localized surface plasmon resonance relies mainly on the above-described aspect ratio. That is, it is deemed that the length of each of the major axis and minor axis of the nanorod particle does not get involved or rarely gets involved in the wavelength dependency of the localized surface plasmon resonance. Therefore, in the present invention, there is no need to particularly limit the dimensions of the nanorod particle. However, it is preferable to apply nanorod particles having minor axes of 10 nm or more and 60 nm or less. When an attempt is made to make the area ratio of modifying nanorod particles, which will be described below, preferable, for excessively large nanorod particles, it becomes difficult to adjust the area ratio. The length of the major axis of the nanorod particle can be controlled with a synthesis condition which determines the growth rate or the like of the nanorod particles and is thus not particularly limited.

As described thus far, the modification of the surface of the transition metal dichalcogenide thin film with the nanorod particles composed of Au and/or Ag is a major characteristic of the present invention. Here, modification in the present invention means a state where one or a plurality of the nanorod particles bonds to the transition metal dichalcogenide thin film surface by the adsorption force of physical adsorption, chemical adsorption or the like or the bonding force of metallic bonds, ionic bonds, covalent bonds or the like. In this case, one kind of nanorod particles may be each in a dispersed state or part or all of the nanorod particles may be in a coupled state.

The number of the nanorod particles on the transition metal dichalcogenide thin film surface is not limited. Surely, it is not that, when the transition metal dichalcogenide thin film is modified with the nanorod particles, the larger the number of the nanorod particles, the better. As described above, the sensitizing action by the nanorod particles develops due to the fact that hot electrons generated by the localized surface plasmon resonance are injected into the transition metal dichalcogenide and the carrier density increases. Excessive modification with the nanorod particles and smaller particle intervals of the nanorod particles than the mean free path of the hot electrons may form conduction paths between the nanorod particles and some of the injection energy may generate a leak current. In addition, the characteristics of the transition metal dichalcogenide thin film as a semiconductor may decrease. Therefore, modification with the nanorod particles such that the thin film surface is wholly or almost wholly coated is not preferred.

The number and amount of the nanorod particles that modify the transition metal dichalcogenide thin film can be regulated based on the rate (density) of the nanorod particles with respect to the surface area of the thin film. As a specific criterion, in an observation of the surface of the transition metal dichalcogenide thin film modified with the nanorod particles, the area ratio of the total areas (projected areas) of the nanorod particles on the thin film based on the area of the observation field region is preferably 0.1% or more and 1% or less. With the area ratio of less than 0.1%, it becomes difficult for the effect of modification with the nanorod particles to appear. In addition, when the area ratio modified with the nanorod particles exceeds 1%, there is a possibility that the above-described sensitizing effect may decrease.

As a specific method for measuring the area ratio of the nanorod particle, it is preferable to measure the area ratio based on the observation field region in a backscattered electron image obtained by observing the surface of the thin film composed of the transition metal dichalcogenide and modified with the nanorod particles using a scanning electron microscope at a magnification of 50000 times to 100000 times. The reason for this magnification is that the observation of the nanorod particles is not possible when the magnification is too low and the distribution of the nanorod particles in the observation field region becomes uneven and the observation result varies when the magnification is too high.

The above-described thin film composed of the transition metal dichalcogenide and modified with the nanorod particles is preferably formed on an appropriate base material. The base material is a member for supporting the thin film composed of the transition metal dichalcogenide. The material of the base material may be any material as long as it is possible to support the thin film composed of the transition metal dichalcogenide. Examples thereof include materials such as glass, quartz, silicon, ceramic and metal. In addition, the shape and dimensions of the base material are not particularly limited.

(A-3) Specific Application of Photoelectric Conversion Element of Present Invention The photoelectric conversion element of the present invention is appropriately made to be a unit as an ordinary photoelectric conversion element and applied to a variety of applications. For example, the photoelectric conversion element can be used as a photoelectric conversion element in optical device applications such as light-receiving elements, optical sensors and light detectors. Particularly, the photoelectric conversion element has an excellent light-receiving sensitivity and is thus useful for light-receiving elements. Specifically, the photoelectric conversion element can be used in the near-infrared region (wavelength range: near 700 nm to near 1600 nm) and has an excellent light-receiving sensitivity and is thus suitable for light-receiving elements in the LIDAR application.

(B) Method for Manufacturing Photoelectric Conversion Element of Present Invention Next, a method for manufacturing the photoelectric conversion element according to the present embodiment will be described. As described thus far, the present invention is characterized in that the surface of the thin film composed of the transition metal dichalcogenide is modified with the nanorod particles. Therefore, a step of modifying the transition metal dichalcogenide thin film with the nanorod particles is essential, but there is no limitations on a film formation step of a transition metal dichalcogenide thin film and a step after nanorod particle modification, which are steps before and after the above-described step. Hereinafter, each step will be described.

(B-1) Film Formation Step of Transition Metal Dichalcogenide Thin Film

A method for forming a transition metal dichalcogenide thin film on a base material is not particularly limited, and a conventional method for manufacturing a transition metal dichalcogenide is applied. Examples of the method for manufacturing a transition metal dichalcogenide include, aside from a metal film reaction method in which a transition metal film is formed on a substrate and thermally treated in a chalcogenide element atmosphere (sulfur gas, selenium gas or the like) to produce a chalcogenide, a sputtering method (reactive sputtering method) and thin film formation processes such as a physical deposition method such as a vacuum deposition method or a chemical deposition method such as a chemical vapor deposition method (CVD method) or an atomic layer deposition method (ALD method). In the present invention, the application of the latter physical deposition method or chemical deposition method is preferable. A particularly preferable film formation method is the chemical deposition method.

According to the chemical deposition method, it is possible to efficiently obtain a transition metal dichalcogenide thin film having a desired film thickness (the number of layers). In the method for manufacturing a transition metal dichalcogenide by the chemical deposition method, a raw material gas obtained by vaporizing an organic metal compound (precursor) of a transition metal is introduced into a reactor that is in a chalcogenide element atmosphere, and a transition metal dichalcogenide is precipitated on a heated substrate. As a precursor of a platinum group metal exemplified as a preferable transition metal in the above description, an organic platinum compound such as dimethyl(N,N-dimethyl-3-butene-1-amine-N)platinum (DDAP), 1,5-hexadienedimethylplatinum (HDMP), (trimethyl)methylcyclopentadienylplatinum (MeCpPtMe$_3$) or bis(acetylacetonato)platinum (Pt(acac)$_2$) is used. In addition, regarding palladium, an organic palladium compound such as bis(hexafluoroacetylacetonato)palladium (Pd(hfac)$_2$), cyclopentadienyl allyl palladium (CpPd(allyl)) or bis(methylallyl)palladium (Pd(Meallyl)$_2$) is used.

(B-2) Modification Step of Nanorod Particles

After the formation of the transition metal dichalcogenide thin film on the substrate, the surface of the thin film is modified with nanorod particles. Methods for generating the nanorod particles are already well known, and several manufacturing processes such as an inverse micelle method, an electrochemical growth method and a colloid growth method (seed-mediated growth method) are known. As a method for manufacturing the nanorod particles, a preferable method is the colloid growth method. The colloid growth method is a method in which nanorod particles can be generated with a relatively simple device and the aspect ratios can be adjusted by appropriately managing the generation conditions.

Regarding the method for manufacturing nanorod particles by the colloid growth method, a method for manufacturing Au nanorod particles will be described as an example. In the colloid growth method of Au nanorod particles, a solution called a growth solution composed of cetyltrimethylammonium bromide (CTAB), silver nitrate (AgNO$_3$), chloroauric acid (HAuCl$_4$) and water is used. To the growth liquid, aside from the above-described components, a surfactant is also added in some cases. In addition, colloid particles, which act as a seed (seed particles), are added to the growth liquid, a reducing agent such as ascorbic acid or hydroquinone is added thereto, and Au particles are grown while Au ions (Au$^{3+}$) in the growth solution is reduced. As the colloid particles, which act as the seed particles, Au colloid or Ag colloid is applied. The colloid particles, which are the seed particles, can be generated by adding a reducing agent (sodium borohydride or the like) to an aqueous solution of a metal salt such as chloroplatinic acid or silver nitrate and CTAB. The seed particles are added to the growth liquid in order to rapidly turn the reduced Au ions into metallic Au (zero valent) and promote the growth of the rod particles. In the manufacturing of the nanorod particles in the colloid growth method, it is possible to adjust the aspect ratios by adjusting the amount of the seed particles added, the composition of the growth liquid, the reaction time after the addition of the reducing agent or the like.

In addition, in a synthetic system (synthetic solution) after the generation of the nanorod particles by the colloid growth method, aside from the nanorod particles having intended aspect ratios, spherical, rectangular and amorphous particles are contained in some cases. Therefore, it is preferable to perform purification on the synthetic system after the generation of the nanorod particles to separate and collect desired nanorod particles. As this purification method, centrifugation is preferable, and desired nanorod particles can be collected by setting the rotation rate (rpm), the centrifugal force (×g) and the treatment time suitable for the aspect ratios. In addition, the aspect ratios of the nanorod particles generated and collected as described above become the aspect ratios of the nanorod particles in the photoelectric conversion element after the modification of the transition metal dichalcogenide thin film.

The transition metal dichalcogenide thin film can be modified with the nanorod particles by dispersing the nanorod particles in an appropriate dispersion medium and applying a dispersion liquid to the thin film. As the dispersion medium at this time, water-based or organic dispersion media such as alcohol, a carboxylic acid solution, an amine salt solution, tetrahydrofuran and chloroform can be used. A method for applying the dispersion liquid of the nanorod particles is not particularly limited and may be a method such as dripping, spraying or immersion; however, preferably, it is preferable to more uniformly apply the dispersion liquid by a spin coating method. In the case of modification with both the Au nanorod particles and the Ag nanorod particles at the same time, a dispersion liquid mixture obtained by mixing the dispersion liquid of the Au nanorod particles and the dispersion liquid of the Ag nanorod particles before the modification of the transition metal dichalcogenide thin film may be applied. In addition, the method may be a stepwise method in which any one of the dispersion liquids of the nanorod particles is applied and then the other dispersion liquid of the nanorod particle is applied.

In addition, the amount (the above-described area ratio) of the nanorod particles on the transition metal dichalcogenide thin film surface can be adjusted with the concentration of the nanorod particles in the dispersion liquid. A preferable concentration of the dispersion liquid for achieving the above-described preferable area ratio becomes 1 nM or higher and 10 nM or lower.

Advantageous Effects of Invention

As described above, the photoelectric conversion element of the present invention has an improved response sensitivity in the near-infrared region compared with conventional transition metal dichalcogenides. The present invention is capable of exhibiting a preferable sensitivity as a light-receiving element while maintaining the advantages of transition metal dichalcogenides such as low manufacturing cost and use at room temperature.

BRIEF DESCRIPTION OF THE DRAWINGS

FIG. 8 is a view showing the measurement result of absorption wavelengths of the Ag nanorod particles manufactured in Second Embodiment;

DETAILED DESCRIPTION OF THE PREFERRED EMBODIMENTS

Figure 1:
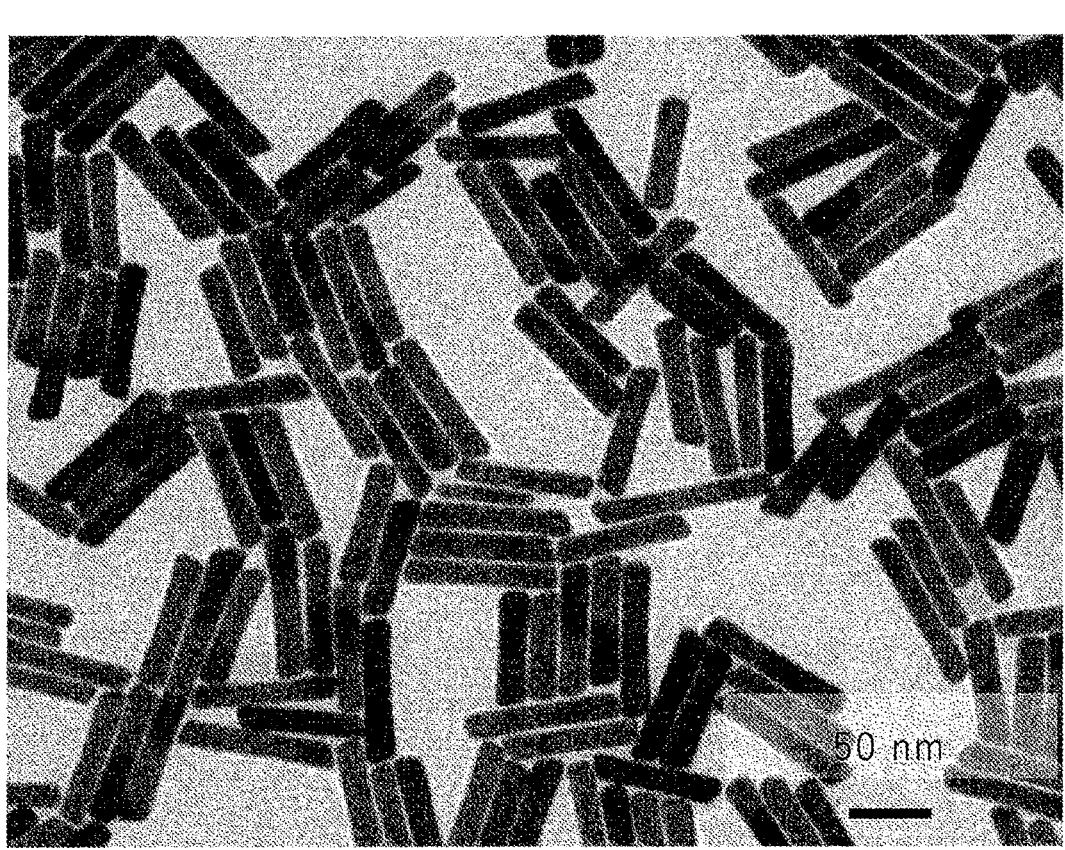
FIG. 1 is a TEM photograph showing the external appearance of Au nanorod particles manufactured in First Embodiment.

First Embodiment: Hereinafter, an embodiment of the present invention will be described. In the present embodiment, a thin film composed of PtSe$_2$ as a transition metal dichalcogenide was formed on a base material. In addition, Au nanorod particles were manufactured as nanorod particles, and the surface of the thin film was modified with these, thereby producing a photoelectric conversion element. Regarding the manufactured photoelectric conversion element, the photoresponsivity to near-infrared rays was evaluated and the surface morphology was studied.

[Manufacturing of Photoelectric Conversion Element]

Formation of Transition Metal Dichalcogenide Thin Film

A Si/SiO$_2$ substrate (surface 280 nm oxidized, dimensions: 20×20, thickness: 1.5 mm) was prepared as a base material, and a PtSe$_2$ thin film was formed on this base material by a CVD method (thermal CVD). First, the substrate was set in a CVD device (hot wall-type horizontal CVD device), and 5 g of a selenium powder was disposed upstream of the substrate. The substrate temperature and the temperature of the selenium powder were each made controllable. The inside of a reactor was purged with an argon gas (200 sccm) before film formation.

In addition, a platinum complex (dimethyl(N,N-dimethyl-3-butene-1-amine-N)platinum (DDAP)) was used as a thin film raw material, the platinum complex was heated and vaporized and, together with a carrier gas, introduced into the reactor, the platinum complex vaporized on the substrate was decomposed, and platinum and selenium were reacted with each other to precipitate PtSe$_2$ on the substrate, thereby forming a PtSe$_2$ thin film. Film formation conditions are as described below. The film thickness of the PtSe$_2$ thin film formed on the base material in this film formation step was 4 nm.

Raw material heating temperature: 67° C.
Carrier gas: Argon/10 sccm
Flow gas: Argon/200 sccm
Substrate temperature/selenium powder heating temperature: 400° C./220° C.
Film formation time: 15 minutes Manufacturing of Au Nanorod Particles Au nanorod particles were manufactured by a colloid particle growth method. In the present embodiment, it was intended to manufacture Au nanorod particles having a maximum absorption wavelength of 940 nm (aspect ratio: 6.0). First, Au colloid particles acting as seed particles were manufactured. 60 μL of 10 mM sodium borohydride, which is a reducing agent, was added to a solution mixture of 0.5 mL of a 0.5 mM chloraurate aqueous solution and 0.5 mL of a 200 mM CTAB aqueous solution and intensively stirred with a Vortex for two minutes, thereby manufacturing Au colloid particles. A Au colloid solution manufactured above, which acted as a seed particle solution, was stored at 30° C. until being used in a manufacturing step of nanorod particles, which is a subsequent step.

A solution mixture of 0.5 mL of a 1 mM chloraurate aqueous solution, 7 μL of a 100 mM silver nitrate aqueous solution and 0.5 mL of a 200 mM CTAB aqueous solution was prepared as a growth liquid. 50 μL of 100 mM hydroquinone was added to this aqueous solution, and, furthermore, 32 μL of the Au colloid particle solution, i.e. seed particle solution manufactured above was added to and mixed with the aqueous solution. Subsequently, the solution mixture was left to stand at 30° C. overnight (16 hours) to generate Au nanorod particles (AuNRs).

Next, a dispersion liquid containing the Au nanorod particles manufactured above was purified. In a purification step of the present embodiment, the dispersion liquid containing the Au nanorod particles manufactured above was centrifuged with a centrifuge under conditions of 12000 g and 10 minutes, pelleted, collected and dispersed in purified water. This was repeated twice, and a dispersion medium was substituted into purified water. Furthermore, a nanorod aqueous solution, for which the dispersion medium had been substituted as described above, was made to account for 10% of the volume, a 100 mM CTAB solution was made to account for 1% of the volume, a 500 mM benzyldimethylammoniumchloride (BDAC) solution was made to account for 40% of the volume, and purified water was added thereto to make the volume 100%. After this solution was left to stand at 30° C. overnight (16 hours), a supernatant containing a by-product was removed, and Au nanorod particles that settled on the bottom surface were collected. Substitution into purified water by centrifugation was repeated twice in the same manner as described above.

Figure 2:
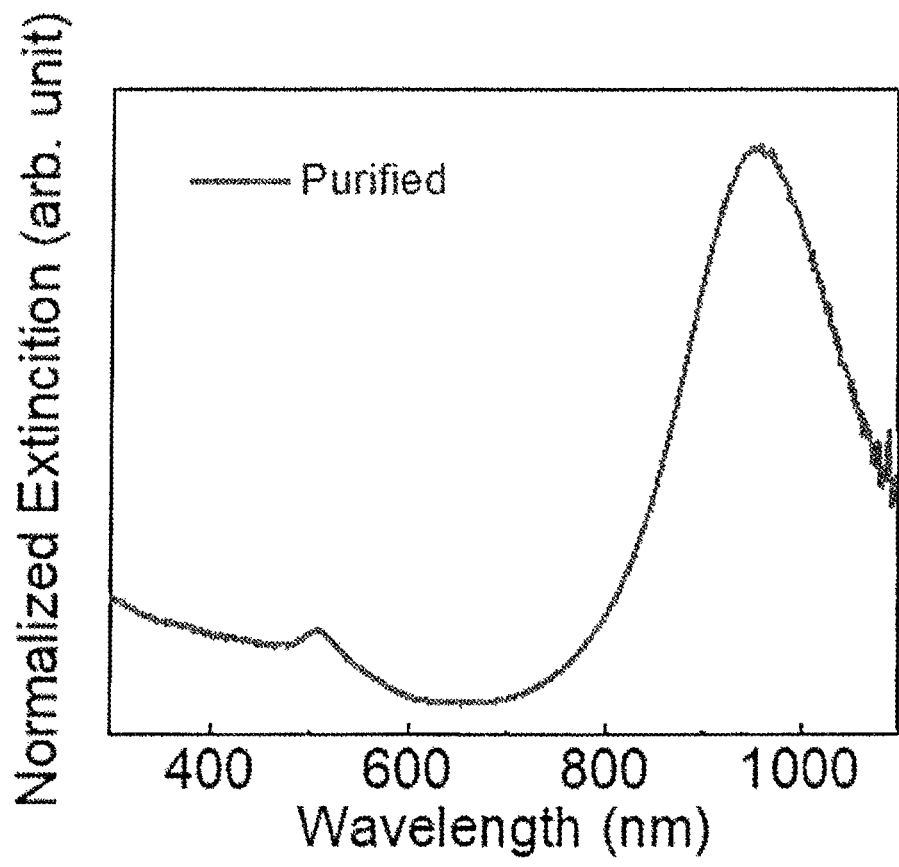
FIG. 2 is a view showing the measurement results of absorption wavelengths of the Au nanorod particles manufactured in First Embodiment.

FIG. 1 is a TEM photograph showing the external appearance of the Au nanorod particles manufactured in the present embodiment. Regarding these Au nanorod particles, the major axis and minor axis lengths were measured, and the aspect ratios were calculated. In this measurement, 200 nanorod particles were arbitrarily extracted from the image, the major axis and minor axis of each nanorod particle were measured, the aspect ratio was calculated, and the average values of the aspect ratios, the major axis lengths and the minor axis lengths were calculated. In the Au nanorod particles manufactured in the present embodiment, the average value of the aspect ratios was 5.9. In addition, the average values of the major axis and minor axis lengths were 97.5 nm and 16.9 nm, respectively. In addition, FIG. 2 shows the measurement result of an absorption spectrum measured with an ultraviolet-visible-near-ultraviolet spectrophotometer regarding the Au nanorod particles manufactured in the present embodiment. For the Au nanorod particles of the present embodiment, it was confirmed that the maximum absorption wavelength was present near approximately 950 nm.

Modification of PtSe$_2$ Thin Film with Au Nanorod Particles and Preparation of Light-Receiving Element Next, regarding the PtSe$_2$ thin film formed above, the surface of the thin film was modified with the Au nanorod particles. In the present embodiment, purified water was used as a dispersion medium, and dispersion liquids in which the (mass-based) concentration of the Au nanorod particles in the dispersion liquid was adjusted to 0.5 nM, 1.0 nM, 5.0 nM, 10 nM, 25 M or 50 nM were prepared. These six nanorod solutions were applied, thereby manufacturing modified transition metal dichalcogenide thin films. The Au nanorod particle dispersion liquids were applied with a spin coater under application conditions where 1 μL of the nanorod solution was applied at 2000 rpm for 30 seconds.

The PtSe$_2$ thin film was modified with the Au nanorod particles, washed and dried, then, a comb-shaped electrode was formed on the thin film surface, thereby manufacturing a light-receiving element, which is a photoelectric conversion element. The comb-shaped electrode was formed by sequentially patterning a Ti film (film thickness: 5 nm) and a Au film (film thickness: 40 nm) in a comb shape on the surface of the PtSe$_2$ thin film modified with the Au nanorod particles.

Comparative Example: As a comparative example with respect to the above-described embodiment, a photoelectric conversion element in which a PtSe$_2$ thin film was not modified with Au nanorod particles was manufactured. In the above-described embodiment, after the formation of the PtSe$_2$ thin film on the substrate, modification with the Au nanorod particles was not performed, and the comb-shaped electrode was formed, thereby producing a light-receiving element.

[Measurement of Area Ratio of Nanorod Particles]

Figure 3:
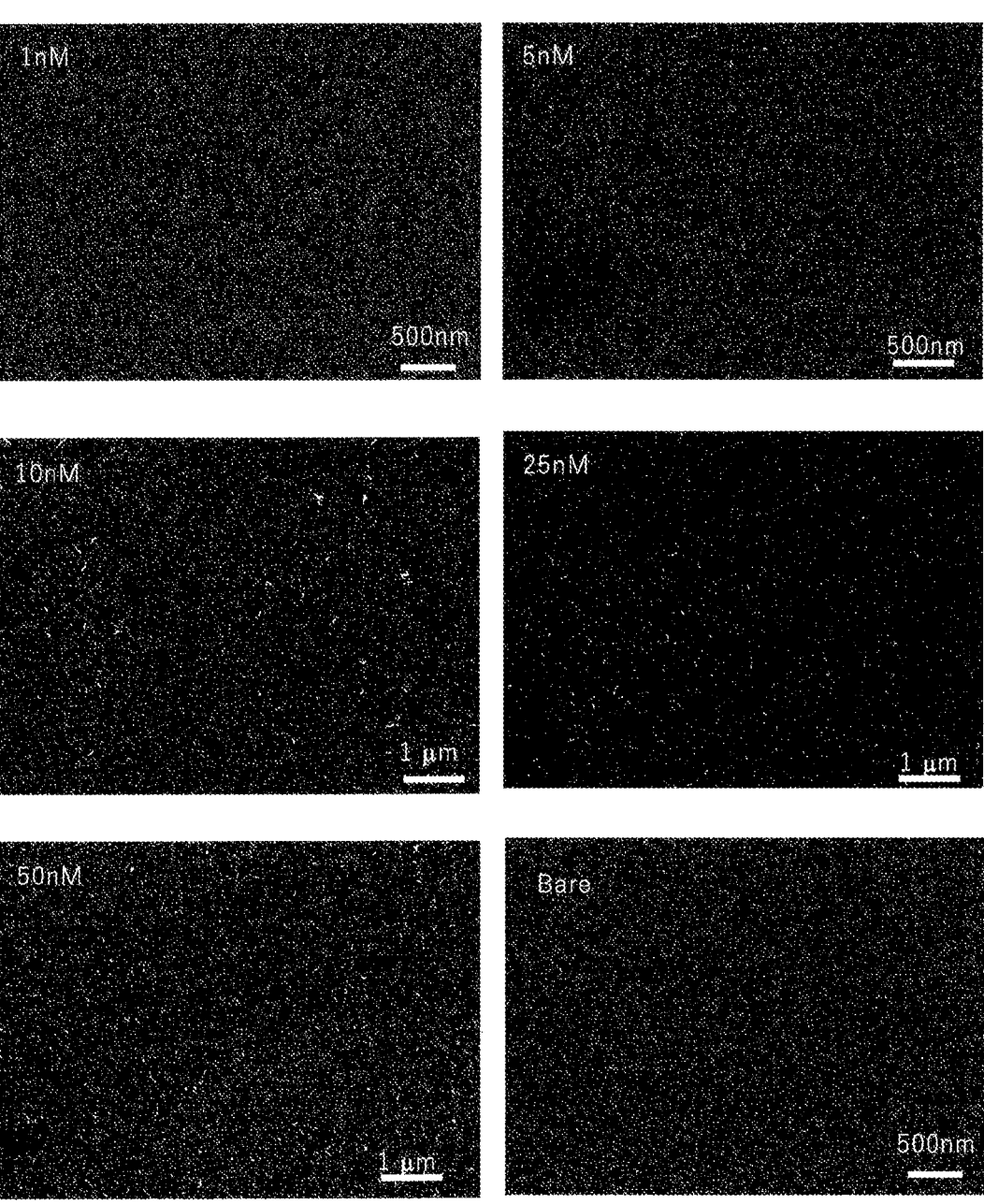
FIG. 3 is a SEM image showing the surface morphology of a photoelectric conversion element (Au nanorod particles/PtSe$_2$) manufactured in First Embodiment.

An example of a SEM image of the Au nanorod particles on the transition metal dichalcogenide thin film surface in the light-receiving element of the present embodiment is shown in FIG. 3. In addition, the area ratio of the nanorod particles was obtained based on the SEM image. In the measurement of the area ratio of the nanorod particles, the ratio of the area of the nanorod particles in an observation region in the image was calculated in percentage (%). This calculation was performed with image analysis software (product name: ImageJ), as analysis conditions, the image was converted to 8 bits and binarized, and the area ratio was obtained from the area of all nanorod particles and the area of the measurement region.

Figure 4:
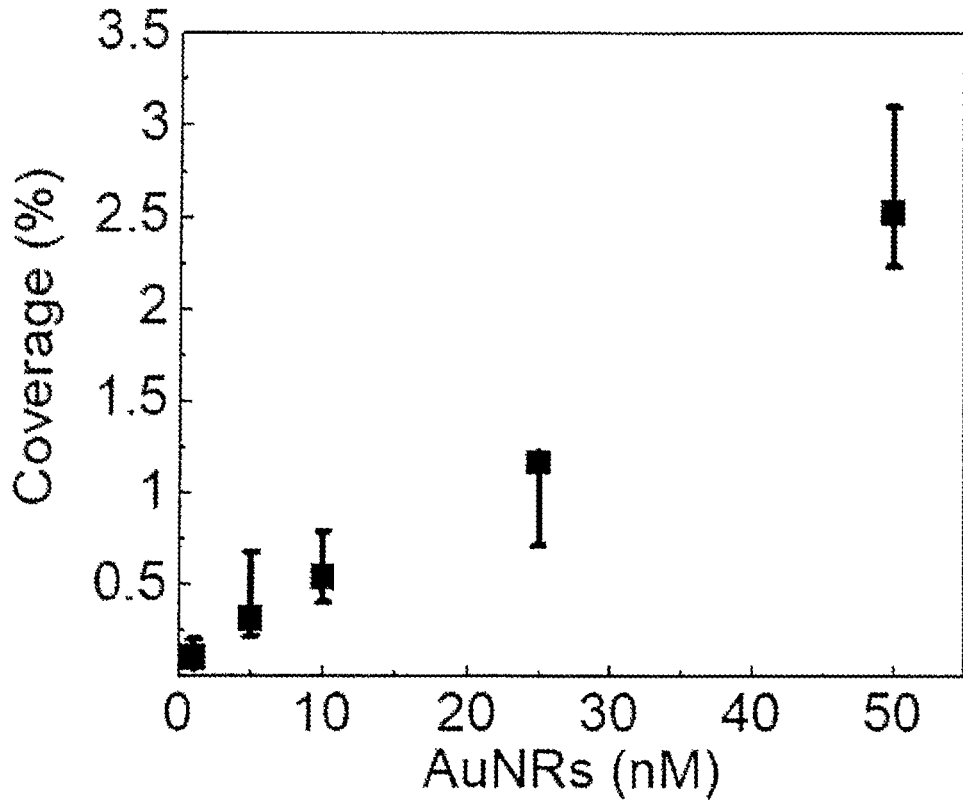
FIG. 4 is a graph showing the relationship between the concentration and area ratio of Au nanorod particles in a Au nanorod solution manufactured in First Embodiment.

FIG. 4 is a view showing the area ratio of the Au nanorod particles on the transition metal dichalcogenide thin film surface modified with the nanorod solution having each concentration. From this figure, it is possible to confirm that there is a proportional relationship between the concentration of the nanorod solution, which is applied to the thin film, and the area ratio of the nanorod particles on the thin film surface and the area ratio can be adjusted with the concentration of the solution.

[Evaluation of Photoresponsivity of Light-Receiving Element]

Regarding the light-receiving elements of the present embodiment and the comparative example prepared above, the photoresponsivity to near-infrared rays was measured. As a measuring method, each light-receiving element was irradiated with near-infrared rays, and a photocurrent was measured at room temperature using a multimeter. The wavelengths of the near-infrared rays used for the irradiation were 740 nm, 850 nm and 940 nm (three patterns), and the response characteristic at each wavelength was measured. Regarding the irradiation with the near-infrared rays, the light-receiving element was continuously irradiated for 20 seconds at 40-second intervals. In a four-terminal method, 0.5 V was loaded as a bias voltage.

Figure 5:
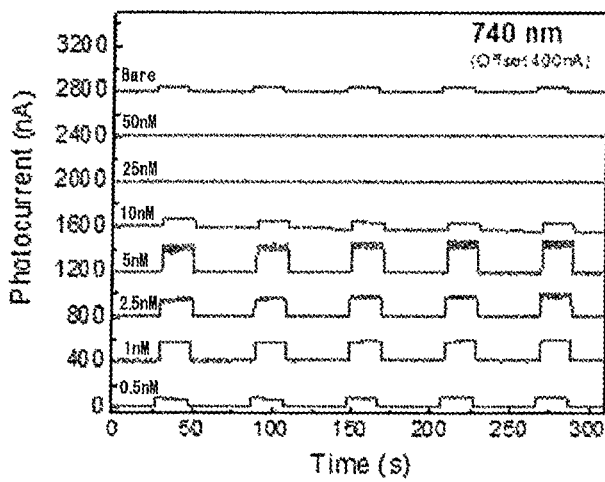
FIG. 5 is a view showing the IR response characteristics of photoelectric conversion elements of First Embodiment and a comparative example.
Figure 5:
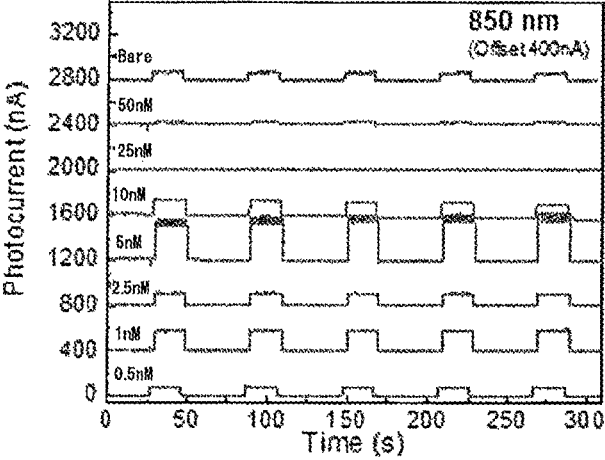
Figure 5:
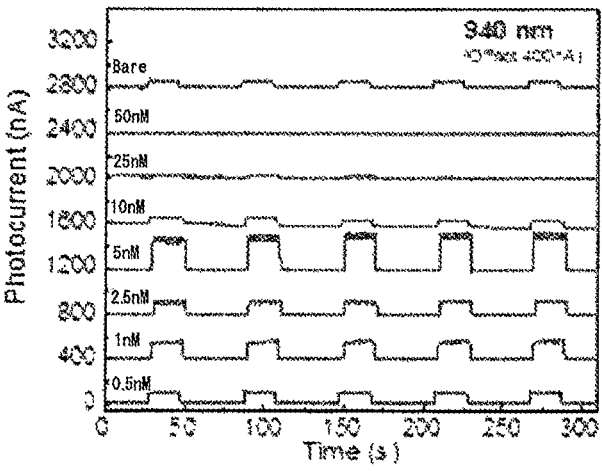
Figure 6:
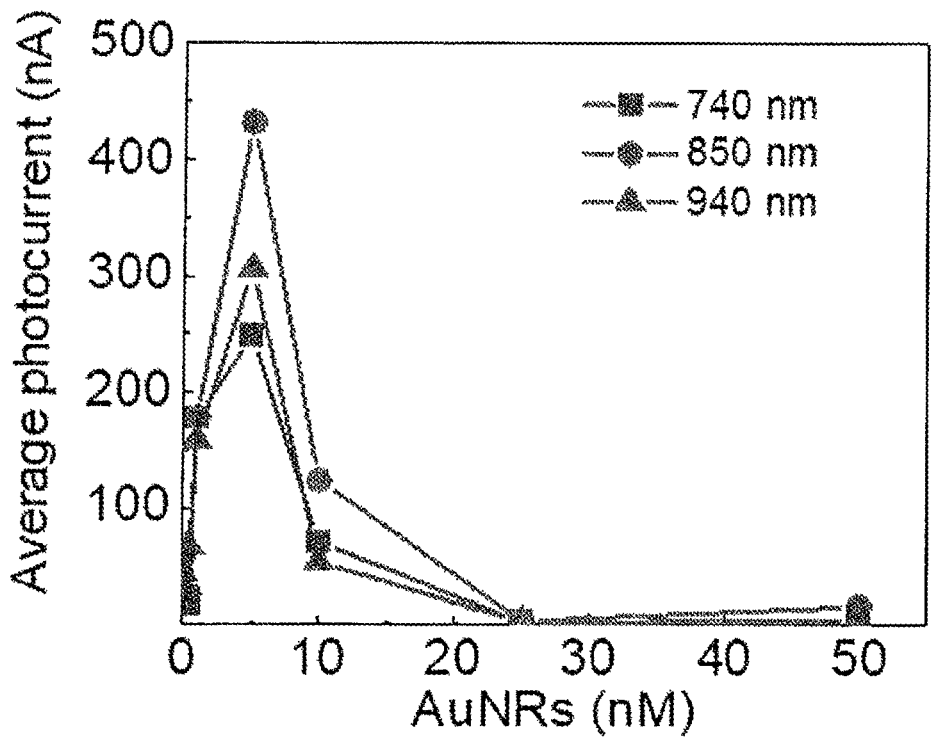
FIG. 6 is a graph showing the relationship between the concentration of an applied nanorod solution and the photocurrent regarding the photoelectric conversion elements of First Embodiment and the comparative example.

The evaluation result of the photoresponsivity is shown in FIG. 5. In FIG. 5, regarding the measurement result of each light-receiving element, the drawing is created by setting an offset every 400 nA. In addition, the relationship between the concentration of the nanorod solution and the maximum photocurrent calculated based on this result is shown in FIG. 6.

From this measurement result of the response characteristic, it was confirmed that the transition metal dichalcogenide thin films ($PtSe_2$ thin films) modified with the Au nanorod particles were capable of generating higher photocurrents in the near-infrared region of 740 nm to 940 nm than thin films not modified with Au nanorod particles. Particularly, in the $PtSe_2$ thin film modified with the nanorod solution having a concentration of 5 nM (the area ratio of the nanorod particles: 0.3%), a photocurrent five or more times higher is generated compared with those in unmodified $PtSe_2$ thin films.

However, when the result of the $PtSe_2$ thin film modified with the nanorod solution having a concentration of 50 nM (the area ratio: 2.5%) is seen, the photocurrent value becomes lower than those of the unmodified $PtSe_2$ thin films. Therefore, it is deemed that excessive modification with the Au nanorod particles is also not preferable.

Second Embodiment: In the present embodiment, a $PtSe_2$ transition metal dichalcogenide thin film was formed on a base material in the same manner as in First Embodiment, and this thin film surface was modified with Ag nanorod particles as nanorod particles, thereby producing a photoelectric conversion element.

[Manufacturing of Photoelectric Conversion Element]

Formation of Transition Metal Dichalcogenide Thin Film

A $PtSe_2$ thin film was formed on the same $SiO_2$ glass substrate as in First Embodiment by a CVD method. The raw material and method for manufacturing this transition metal dichalcogenide thin film were the same as those in First Embodiment, and the film thickness of the $PtSe_2$ thin film was 4 nm.

Manufacturing of Ag Nanorod Particles

Ag nanorod particles were manufactured by a colloid particle growth method. In the present embodiment, it was intended to manufacture Ag nanorod particles having a maximum absorption wavelength of 940 nm (aspect ratio: 5.0). First, Ag colloid particles acting as seed particles were manufactured. 50 μL of 50 mM sodium citrate, 3 μL of 0.5 mM polyvinylpyrrolidone, 5 μL of 5 mM L-arginine and 20 μL of silver nitrate were added to 700 μL of water and stirred well. 8 μL of 100 mM sodium borohydride, which is a reducing agent, was added to this solution mixture and intensively stirred with a Vortex for two minutes, thereby manufacturing Ag colloid particles (seed particles). A Ag colloid particle solution, which was this seed particle solution, was stored at 30° C. for 15 minutes until being used in a manufacturing step of nanorod particles, which is a subsequent step.

Upon the manufacturing of the Ag nanorod particles, first, the seed particle solution prepared above was irradiated with a blue diode array lamp for 16 hours to generate regular decahedron silver nanoparticles. After that, 1 mL of a generated regular decahedron silver nanoparticle solution was centrifuged for 10 minutes at 12000 g to remove a supernatant and dispersed in 500 μL of water to be purified. 1 mL of water, 200 μL of sodium citrate and 33 μL of 0.5 mM polyvinylpyrrolidone were put into a 20 mL glass vial and preheated with an output of 100 W for one minute in a microwave, thereby preparing a growth liquid. 500 μL of the regular decahedron silver nanoparticle solution purified above and 200 μL of 10 mM silver nitrate were added to and mixed with this aqueous solution and further heated for 15 minutes, thereby obtaining Ag nanorod particles.

Figure 7:
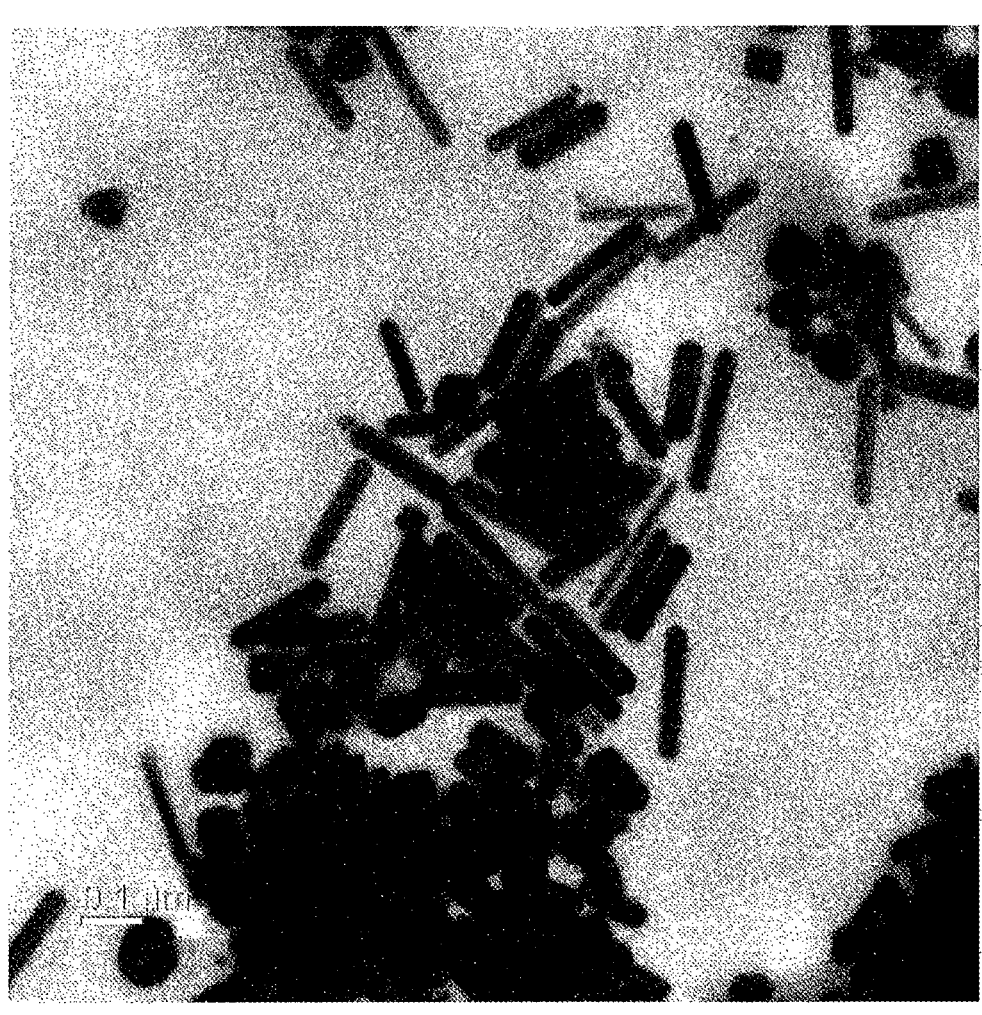
FIG. 7 is a TEM photograph showing the external appearance of Ag nanorod particles manufactured in Second Embodiment.
Figure 8:
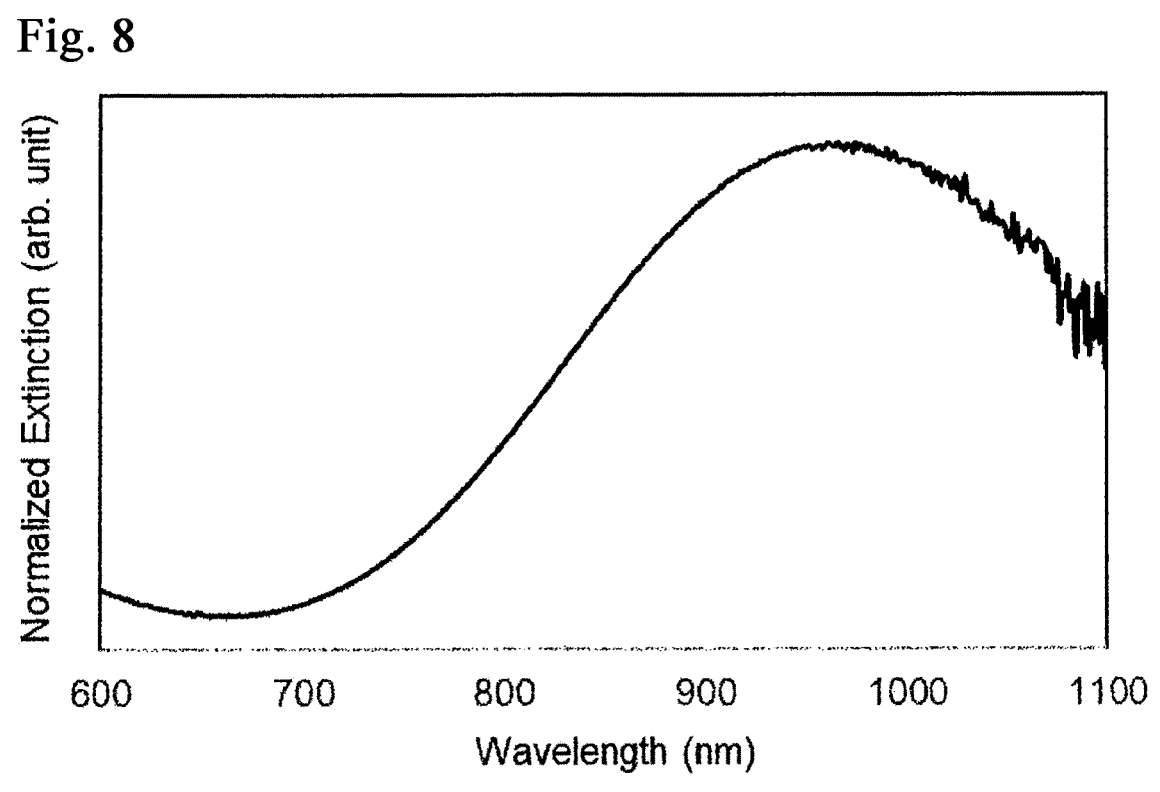

FIG. 7 is a TEM photograph showing the external appearance of the Ag nanorod particles manufactured in the present embodiment. Regarding these Ag nanorod particles, the major axis and minor axis lengths were measured, and the aspect ratios were calculated in the same manner as in First Embodiment. In the Ag nanorod particles manufactured in the present embodiment, the average value of the aspect ratios was 4.9. In addition, the average values of the major axis and minor axis lengths were 187.9 nm and 37.7 nm, respectively. In addition, FIG. 8 shows the measurement results of absorption wavelengths measured in the same manner as in First Embodiment regarding the Ag nanorod particles. For the Ag nanorod particles of the present embodiment, it was confirmed that the maximum absorption wavelength was present near approximately 950 nm.

Modification of $PtSe_2$ Thin Film with Ag Nanorod Particles and Preparation of Light-Receiving Element Next, regarding the $PtSe_2$ thin film formed above, the surface of the thin film was modified with the Ag nanorod particles. In the present embodiment, purified water was used as a dispersion medium, and the concentration of the Ag nanorod particles was adjusted so that the absorbance of a dispersion liquid reached 2.5, thereby preparing the dispersion liquid (the concentration of the Ag nanorod particles: 1 nM). The Ag nanorod particle dispersion liquid was applied with a spin coater under application conditions where 1 μL of the nanorod solution was applied at 2000 rpm for 30 seconds.

Figure 9:
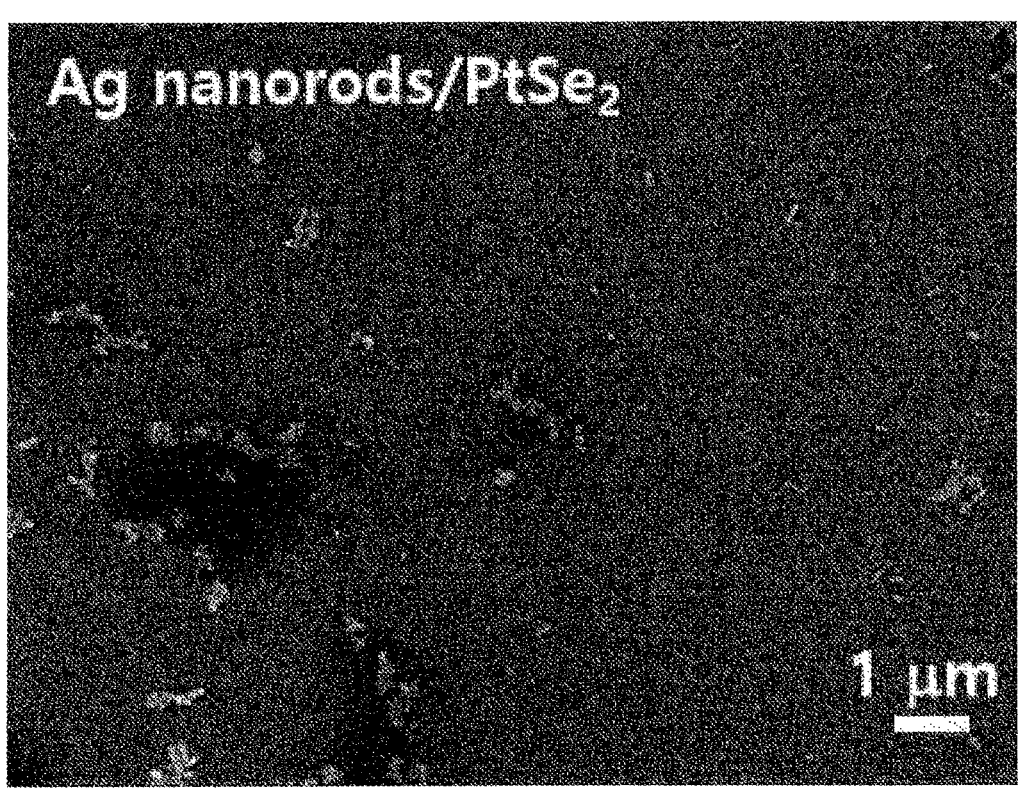
FIG. 9 is a SEM image showing the surface morphology of a photoelectric conversion element (Ag nanorod particles/PtSe$_2$) manufactured in Second Embodiment.

The $PtSe_2$ thin film was modified with the Ag nanorod particles, washed and dried, then, a comb-shaped electrode was patterned and formed on the thin film surface in the same manner as in First Embodiment, thereby manufacturing a light-receiving element, which is a photoelectric conversion element. An example of a SEM image of the Ag nanorod particles on the $PtSe_2$ thin film surface in the light-receiving element manufactured in the present embodiment is shown in FIG. 9. As a result of measuring the area ratio of the Ag nanorod particles base on this SEM image in the same manner as in First Embodiment, the area ratio was 0.98%.

[Evaluation of Photoresponsivity of Light-Receiving Element]

Regarding the light-receiving element of Second Embodiment produced above, the photoresponsivity to near-infrared rays was measured. The measurement method is the same as in First Embodiment, and the response characteristic to near-infrared rays at each wavelength of 740 nm, 850 nm and 940 nm was measured. In the present embodiment as well, the measurement was performed on a light-receiving element not modified with the Ag nanorod particles as a comparative example.

Figure 10:
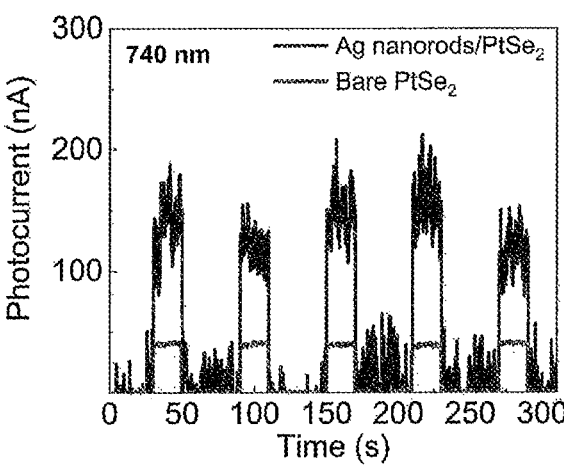
FIG. 10 is a view showing the IR response characteristics of photoelectric conversion elements of Second Embodiment and a comparative example.
Figure 10:
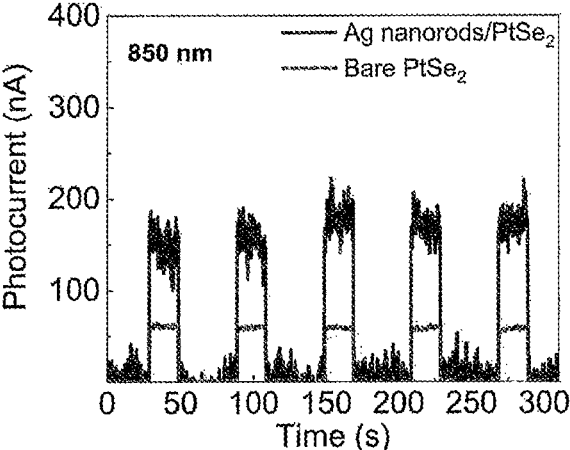
Figure 10:
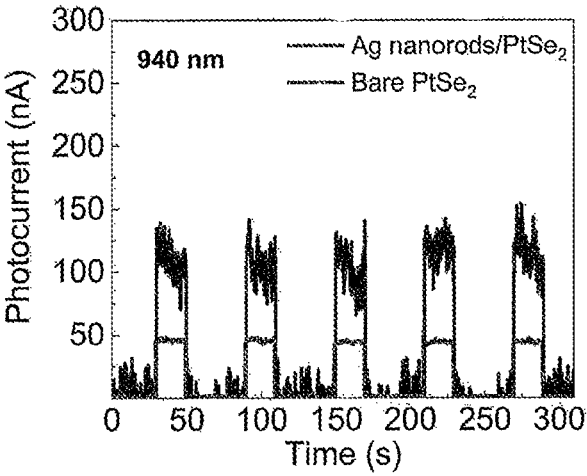

The evaluation result of the photoresponsivity is shown in FIG. 10. From this measurement result of the response characteristic, it was confirmed that the transition metal dichalcogenide thin films ($PtSe_2$ thin films) modified with the Ag nanorod particles were also capable of generating higher photocurrents in the near-infrared region of 740 nm to 940 nm than thin films not modified with Ag nanorod particles.

From the results of First Embodiment (Au nanorod particles) and Second Embodiment (Ag nanorod particles)

described above, the sensitizing actions of the transition metal dichalcogenide thin films by these were confirmed. For these Au/Ag nanorod particles, it is possible to adjust the aspect ratios by changing manufacturing conditions. Therefore, the Au/Ag nanorod particles show optical characteristics in accordance with the aspect ratios.

As an example of the manufacturing condition of the nanorod particles for aspect ratio adjustment, the amount and concentration of the seed particle solution (that is, the number of the seed particles) at the time of adding the seed particle solution to the growth liquid are prepared. For example, in the manufacturing of the Au nanorod particles of First Embodiment, 32 µL of the seed particle solution is mixed with the growth solution to obtain Au nanorod particles having aspect ratios of 5.9. In order to make the aspect ratios of the Au nanorod particles larger, the amount of the seed particle solution added may be smaller than that in First Embodiment. Conversely, in order to obtain Au nanorod particles having smaller aspect ratios than those in First Embodiment, the amount of the seed particle solution added may be larger than that in First Embodiment.

In addition, the aspect ratios of the nanorod particles can also be adjusted with the heating time (reaction time) after the addition of the seed particle solution to the growth liquid. In the manufacturing of the Ag nanorod particles of Second Embodiment, the regular decahedron silver nanoparticles were used as the seed particles, and these were mixed with silver nitrate and heated for 15 minutes, thereby manufacturing Ag nanorod particles having an average aspect ratio of 4.9. When this heating time is extended, it is possible to make the aspect ratios of the Ag nanorod particles larger than those in Second Embodiment.

Therefore, based on First and Second Embodiments, the amount of the seed particle solution added and the heating time were prepared, and Au nanorod particles having an aspect ratio (average value) of 12.0 and Ag nanorod particles having an aspect ratio (average value) of 13.0 were manufactured. Regarding each of the manufactured nanorod particles, the absorption wavelength was measured in the same manner as in First Embodiment.

Figure 11:
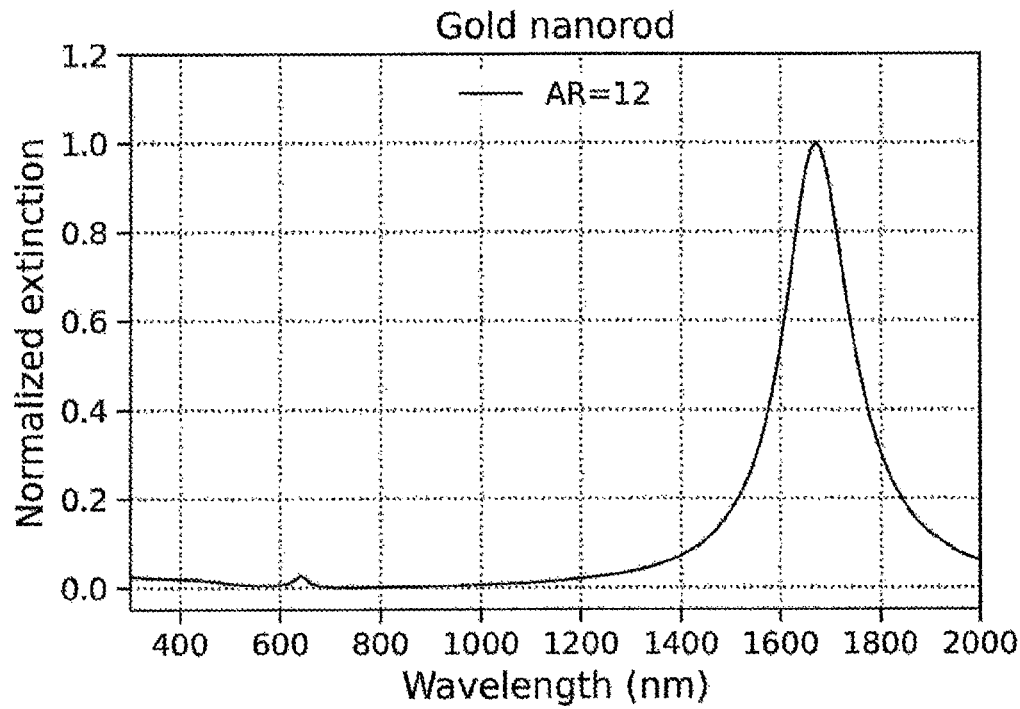
FIG. 11 is a view showing the measurement results of the absorption wavelengths of Au nanorod particles (aspect ratio: 12.0) and Ag nanorod particles (aspect ratio: 13.0) manufactured with reference to Second Embodiment.
Figure 11:
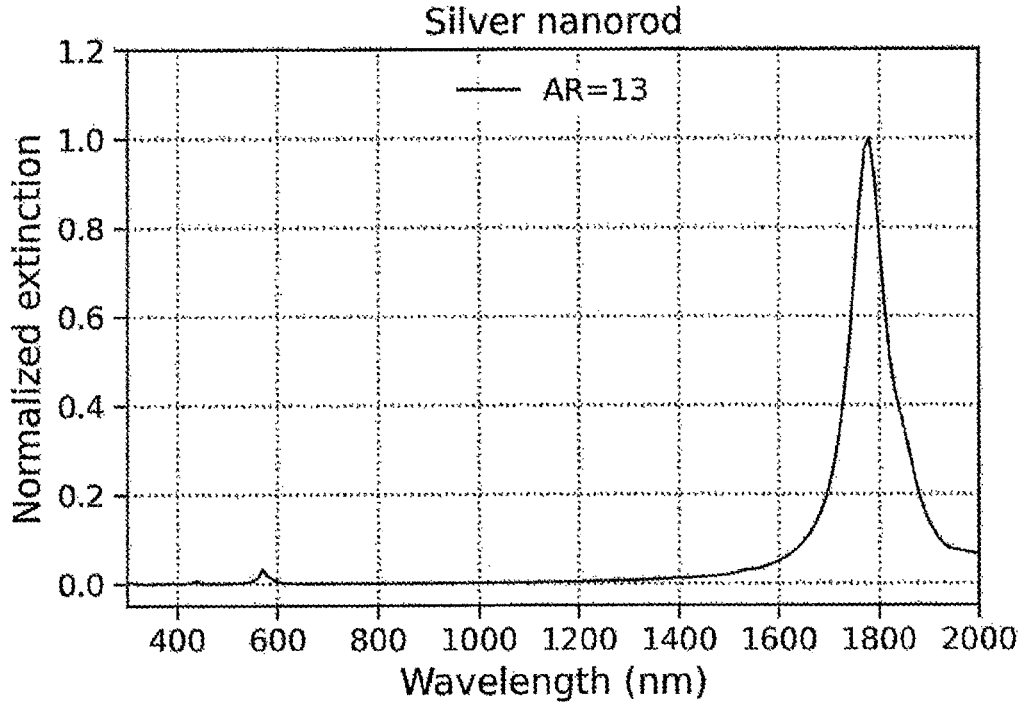

FIG. 11 is a view showing the measurement results of the absorption wavelengths of the Au nanorod particles (aspect ratio: 12.0) and the Ag nanorod particles (aspect ratio: 13.0). The maximum absorption wavelength of the Au nanorod particles having an aspect ratio of 12.0 reaches approximately 1680 nm. The maximum absorption wavelength of the Ag nanorod particles having an aspect ratio of 13.0 reaches approximately 1780 nm. As such, it is found that, regarding the Au and Ag nanorod particles, it is possible to optimize the light absorption characteristic by preparing the aspect ratios. Therefore, it was confirmed that the Au and Ag nanorod particles act on light having wavelengths in the near-infrared region up to near 1600 nm.

INDUSTRIAL APPLICABILITY

As described above, the photoelectric conversion element to which the transition metal dichalcogenide thin film according to the invention is applied has an improved photoresponsivity in the near-infrared region compared with conventional transition metal dichalcogenide thin films. The present invention can provide a high-sensitivity photoelectric conversion element while utilizing the preferable conditions of transition metal dichalcogenide thin films such as low manufacturing cost or adaptability at room temperature. The present invention is particularly useful as a light-receiving element that deals with the near-infrared region and can be expected to contribute to additional improvement in the measurement accuracy of LIDAR as a material for light-receiving elements in the LIDAR application.

What is claimed is:

1. A photoelectric conversion element comprising: a base material; and a thin film formed on the base material and composed of a transition metal dichalcogenide, the photoelectric conversion element acting only in a wavelength range between 700 nm and 1600 nm, wherein the transition metal dichalcogenide is a chalcogenide of Pt or Pd, and a surface of the thin film composed of the transition metal dichalcogenide is modified with nanorod particles selected from the group consisting of (a) Au nanorod particles composed of Au and having an average aspect ratio of 3.0 or more and 12.0 or less and (b) Ag nanorod particles composed of Ag and having an average aspect ratio of 3.0 or more and 13.0 or less, and in an observation of the surface of the thin film composed of the transition metal dichalcogenide and modified with the nanorod particles, an area ratio of the nanorod particles in an observation field region is 0.1% or more and 1% or less.

2. The photoelectric conversion element according to claim 1, wherein a chalcogenide element of the transition metal dichalcogenide is any of sulfur, selenium or tellurium.

3. The photoelectric conversion element according to claim 2, wherein an average of minor axes of the nanorod particles is 10 nm or more and 60 nm or less.

4. The photoelectric conversion element according to claim 2, wherein the base material is composed of any of glass, quartz, silicon, carbon, ceramic or metal.

5. The photoelectric conversion element according to claim 1, wherein an average of minor axes of the nanorod particles is 10 nm or more and 60 nm or less.

6. The photoelectric conversion element according to claim 5, wherein the base material is composed of any of glass, quartz, silicon, carbon, ceramic or metal.

7. The photoelectric conversion element according to claim 1, wherein the base material is composed of any of glass, quartz, silicon, carbon, ceramic or metal.

8. A light-receiving element comprising the photoelectric conversion element defined in claim 1.

9. A light-receiving element comprising the photoelectric conversion element defined in claim 2.

* * * * *